(12) United States Patent
Hwan

(10) Patent No.: US 7,413,670 B2
(45) Date of Patent: Aug. 19, 2008

(54) METHOD FOR FORMING WIRING ON A SUBSTRATE

(75) Inventor: Lu-Chen Hwan, Taipei (TW)

(73) Assignee: Mutual-Pak Technology Co., Ltd., Xinzhuang (TW)

( * ) Notice: Subject to any disclaimer, the term of this patent is extended or adjusted under 35 U.S.C. 154(b) by 0 days.

(21) Appl. No.: 10/875,551

(22) Filed: Jun. 25, 2004

(65) Prior Publication Data

US 2005/0284841 A1    Dec. 29, 2005

(51) Int. Cl.
*H01B 13/00*    (2006.01)

(52) U.S. Cl. .............................. 216/20; 216/36; 216/41

(58) Field of Classification Search ........................ None
See application file for complete search history.

(56) References Cited

U.S. PATENT DOCUMENTS

| 4,562,119 | A | * | 12/1985 | Darms et al. ................ 428/458 |
| 4,806,725 | A | * | 2/1989 | Narizuka et al. ............ 347/203 |
| 4,990,934 | A | * | 2/1991 | Takeuchi et al. ............ 347/199 |
| 5,417,164 | A | * | 5/1995 | Nishida et al. .............. 101/453 |
| 5,426,850 | A | * | 6/1995 | Fukutomi et al. ............. 29/848 |
| 5,445,608 | A | * | 8/1995 | Chen et al. ..................... 604/20 |
| 5,589,007 | A | * | 12/1996 | Fujioka et al. .............. 136/249 |
| 5,690,747 | A | * | 11/1997 | Doscher ........................ 134/1 |
| 6,440,835 | B1 | * | 8/2002 | Lin ............................ 438/611 |
| 6,794,965 | B2 | * | 9/2004 | Shen et al. .................... 335/78 |
| 2004/0001957 | A1 | * | 1/2004 | Seita et al. .................. 428/457 |
| 2004/0159224 | A1 | * | 8/2004 | Raisanen ..................... 84/730 |
| 2004/0202958 | A1 | * | 10/2004 | Kataoka et al. .......... 430/270.1 |
| 2005/0007218 | A1 | * | 1/2005 | Shen et al. .................... 335/78 |

FOREIGN PATENT DOCUMENTS

| JP | 2003234564 A | * | 8/2003 |
| TW | 556453 |  | 10/2003 |

* cited by examiner

*Primary Examiner*—Allan Olsen
(74) *Attorney, Agent, or Firm*—Snell & Wilmer L.L.P.

(57) ABSTRACT

A method for forming a wiring on a substrate includes the steps of preparing a copper substrate, plating a copper-nickel layer on a portion of the copper substrate, combining the copper substrate with a soft polyimide substrate, and etching the copper substrate.

5 Claims, 3 Drawing Sheets

METHOD FOR FORMING WIRING ON A SUBSTRATE

BACKGROUND OF THE INVENTION

1. Field of the Invention

The present invention relates to a method of forming wiring on a substrate, and more particularly to a method of printing the wiring on the substrate.

2. Description of Related Art

Currently there are three different ways of encapsulating a drive IC (integrated circuit) on a liquid crystal display (LCD), namely, 1, a Tape Carrier Package (TCP); 2, a Chip On Flex (COF); and 3, a Chip on Glass (COG). The first method and the second method require a soft circuit board to function as the carrier base board to combine the glass plate and the printed circuit board (PCB) on the display. The soft circuit board for the driver IC is divided into three categories:

The first soft circuit board:

With reference to FIGS. 1A and 1B, it is noted that the very bottom is a copper layer (51). The second layer is an adhesive layer (52) and the third layer is a soft polyimide (PI) layer (53). In particular, the structure shown in FIG. 1B indicates that besides the structure being the sane as that of FIG. 1A, a second adhesive layer (52a) is attached to a free side of the polyamide layer (53), and a second copper layer (51a) is then attached to a free side of the second copper layer (52a). While forming the wiring on the copper layer (51), due to the etching process required to form the wiring on the copper layer (51), the thickness of the copper layer (51) has to at least be 12 μm due to the handling issue so that the effective product yield rate is high. However if the copper layer thickness is big, it will be very difficult for making slender wiring. For example, if the copper layer thickness is big, and the wiring has an average of 40-45 μm pitch (25 μm in width and 20 μm in-between), the effective product yield rate becomes low and that is why the current standard in industrial business is at the range of 45 μm pitch. When the wiring pitch is below 45 μm, a copper film having such as 12 or 9 μm thickness is required. Nevertheless, using a copper foil of this thickness still has its drawbacks. That is, the thin copper foil wrinkles easily during the wiring forming process and this causes a high defect rate. Therefore, the cost is high.

The second soft circuit board:

With reference to FIGS. 2A and 2B, it is noted that there is no adhesive layer when compared with the embodiment in FIGS. 1A and 1B. The structure comprises a polymide substrate (54), a Monel layer (alloy of nickel and copper) sputtered on a surface of the polyimide layer (54) and a copper layer (55) attached to the Moriel layer. Thereafter, the thickness of the copper layer (55) is controlled by plating to reach 6 or 9 μm. With this method, it is not required to press the copper foil on the polyimide (PI) substrate (54) such that the effective product yield rate is high at fine pitch circuitry such as lower than 40 μm pitch. Furthermore, due to the thickness of the copper foil being controlled by plating, the operator is able to make wires with the required pitch and width, which often reaches a standard well below 30 μm. However, because there is no adhesive layer used to bond the metal layer and the soft polymide substrate, the metal layer sometimes peels off the substrate. Furthermore, the plated copper layer breaks easily so that the reliability of the encapsulated element is unsatisfactory. A further disadvantage is that the Monel and Cr layer is not easily etched away due to a good chemical bonding on Ri film such that electricity leakage occurs.

The third soft circuit board:

The third soft polyimide substrate is achieved by applying a polyimide (PI) directly onto the copper foil to create a substrate similar to the substrate without an adhesive layer. This kind of substrate has problems such as the contraction of copper foil thickness in the curing process and being inapplicable to a thickness under 12 μm. As a result, this product has little market share.

To overcome the shortcomings, the present invention tends to provide an improved wire forming method to mitigate the aforementioned problems.

SUMMARY OF THE INVENTION

The primary objective of the present invention is to provide an improved wire forming method to use a printing method to form a wiring pattern on the substrate. Because the flat surface and the stiffness of the substrate, the wiring pattern is able to have good support from the substrate and does not break easily during the curing process.

In order to accomplish the foregoing objective, the method comprises the following steps:

preparing a copper substrate;

dry film or photo resist process so the required circuitry pattern will be developed on the substrate;

plating a copper-nickel layer on a portion of the copper substrate;

dry film or photo resist stripping then thermal treating the plated copper substrate up to the required metallurgy;

combining the copper substrate with a soft polyimide substrate; and etching the copper substrate.

Another objective of the present invention is that before plating the copper-nickel layer on the copper substrate, a dry film is formed.

Still another objective of the present invention is that in the etching step, the copper substrate is entirely etched away.

Other objects, advantages and novel features of the invention will become more apparent from the following detailed description when taken in conjunction with the accompanying drawings.

DETAILED DESCRIPTION OF THE PREFERRED EMBODIMENT

The primary technique of the present invention is to print a wiring pattern on a copper substrate (1). Because of the nature of copper, the copper substrate (1) is able to provide sufficient support to the wiring after the wiring is formed. Furthermore, due to the flat surface of the copper substrate (1), it is easy to form slender wiring on the substrate such that the effective product rate is high.

Figure 1A:
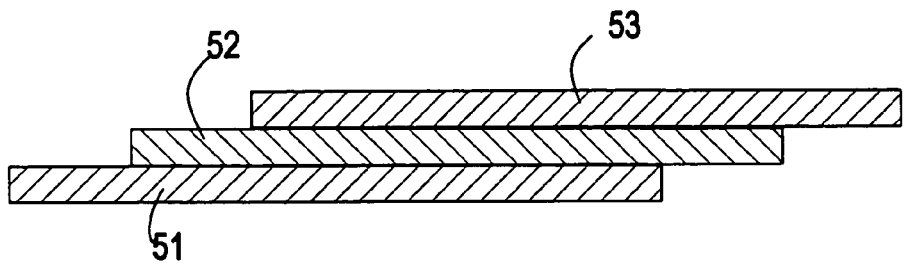
FIGS. 1A and 1B are schematic views showing the structure of a conventional three-layer copper substrate.
Figure 1B:
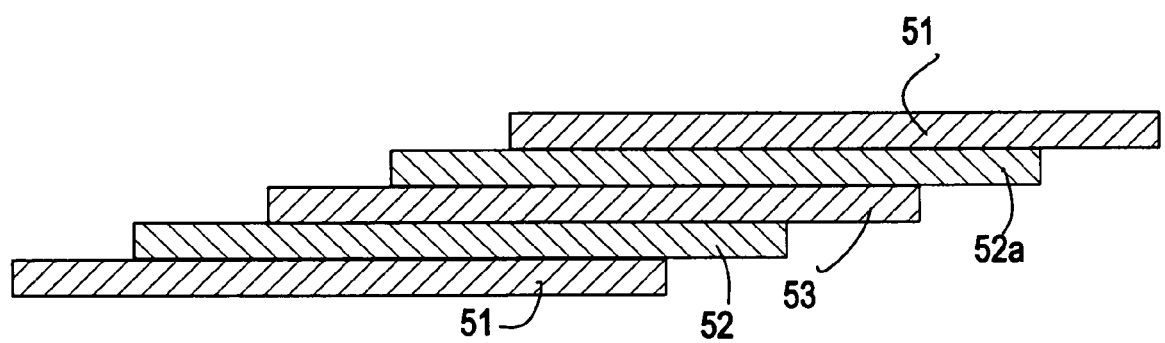
Figure 2A:
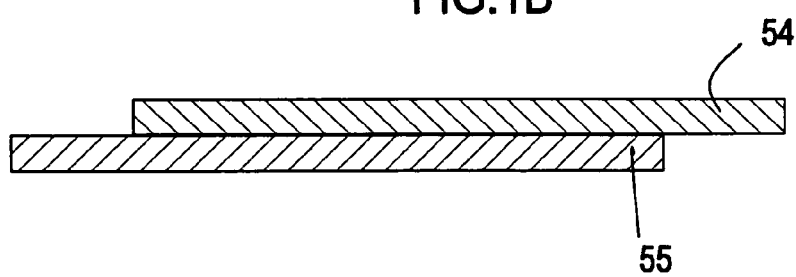
FIGS. 2A and 2B are schematic views showing the structure of a conventional two-layer copper substrate.
Figure 2B:
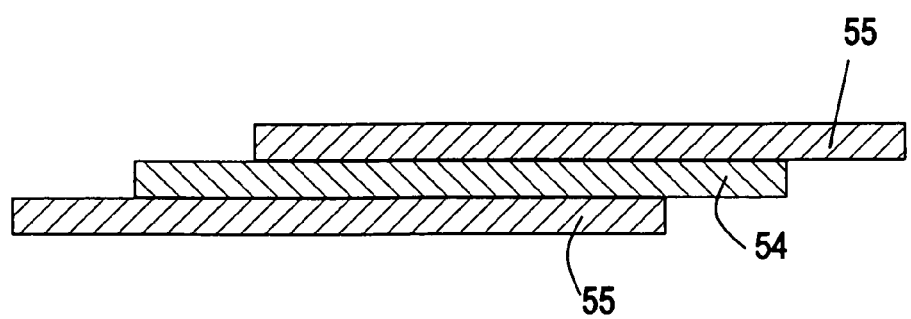
Figure 3:
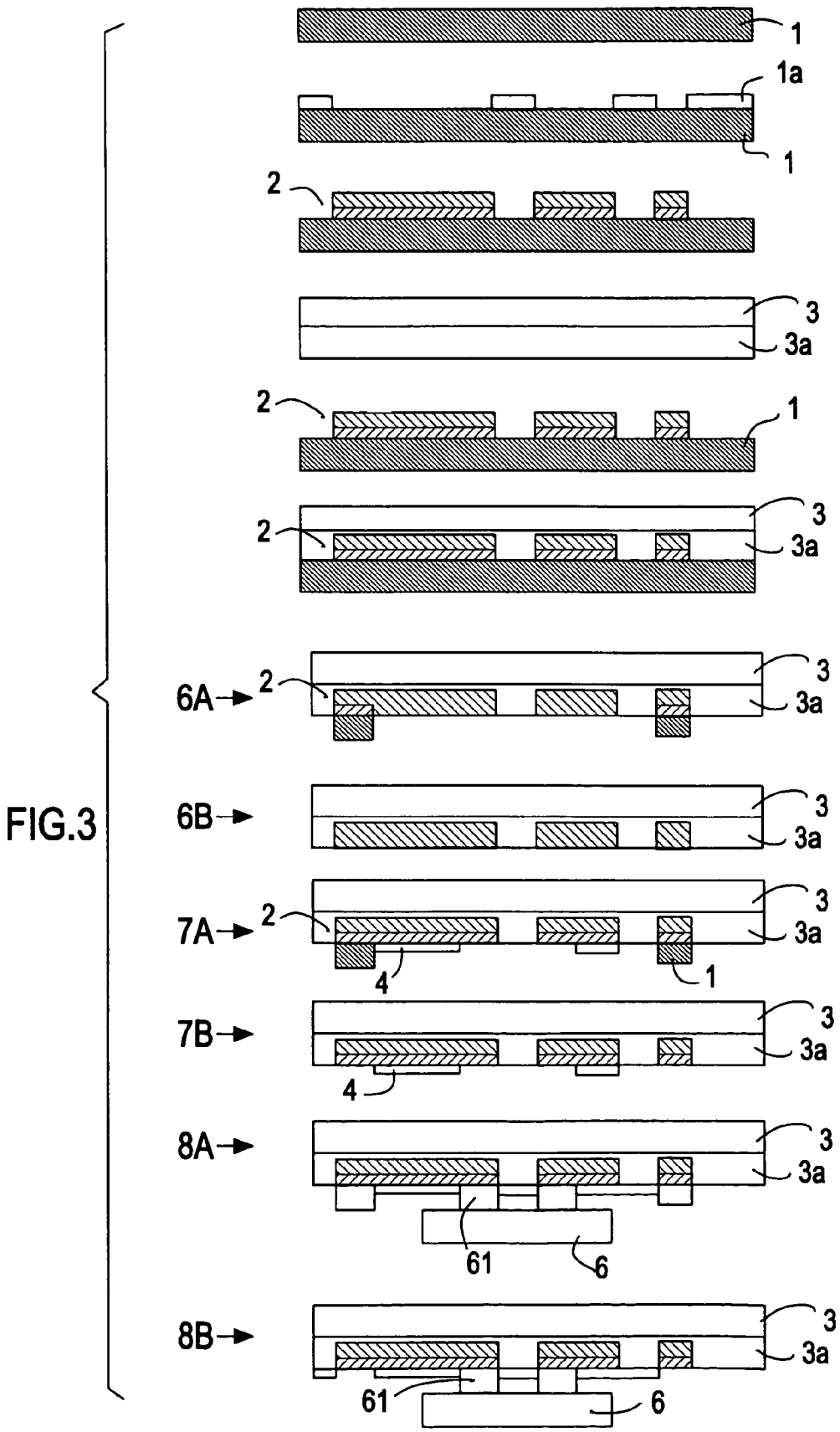
FIG. 3 is a flow chart of the method of the present invention.

With reference to FIG. 3, it is to be noted that a wiring pattern is printed onto a surface of a copper substrate (1).

Then the copper substrate (1) is processed through a dry film process to allow the application of a photo-resistant material (1a) onto a surface of the copper substrate (1) to stop attachment of copper and nickel onto the copper substrate surface in the copper-nickel plating process.

Then the photo-resistant material (1a) is removed in a washing step. The copper substrate (1) with a copper-nickel layer (2) onto the copper substrate surface is pressed on a polyimide substrate (3) with an adhesive layer (3a) thereon. After the pressing process, the copper-nickel layer (2) is ready for the wiring of the substrate is supported by the stiffness of the copper substrate (1) such that contraction or expansion during the curing process will not affect the effectiveness of the wiring.

Thereafter, a portion of the copper substrate (1) is etched through (as shown in step 6B) to leave the copper-nickel layer (2) on the soft polyimide substrate (3) having the adhesive layer (3a) thereon or only a portion of the copper substrate (1) is etched (as shown in step 6B).

It is noted that the difference between the two different steps (step 6A and step 6B) is dependent on the later application of the user.

After the aforementioned steps, nickel (Ni), gold (Au) or tin (Sn) is plated and a welding proof membrane (4) is applied on the polyimide substrate (3). The 8A and 8B steps are to show the application of the product in steps 7A and 7B, wherein steps. 8A and 8B are to show that an integrated circuit (IC) (6) is welded onto the wiring of the present invention via bosses (61).

It is summarized that the steps of the present invention include:

preparing a copper substrate;

laminating or coating dry film photo resist then developing the required circuitry pattern.

plating a copper-nickel layer on a portion of the copper substrate;

stripping the dry film photo resist then thermal treating the plated copper to the required performance.

combining the copper substrate with a soft polyimide substrate; and etching the copper substrate.

Figure 4A:
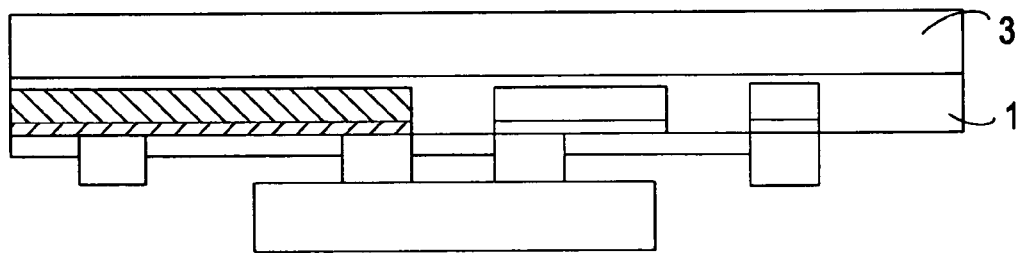
FIGS. 4A and 4B are schematic views showing the application of the substrate with a wiring pattern on the substrate in accordance with the present invention.
Figure 4B:
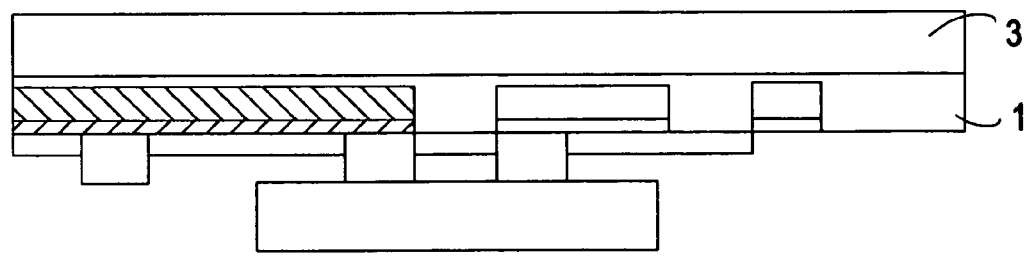

With reference to FIGS. 4A and 4B, the advantages of the present invention include:

Although the wiring is formed on the soft polyimide substrate, the wiring is first formed on the copper substrate such that after the curing process to the copper substrate, the wiring has good extension, electrical conduction and resiliency features. As a consequence, the physical phase change of the wiring is supported by the copper substrate (1) and the effective product yield rate is increased.

During the manufacture process, the wiring is formed on the copper substrate and the copper substrate is pressed onto the polyimide substrate (3) with an adhesive layer (3a) thereon so that the wiring is embedded in and protected by the adhesive layer (3a) after the etching away of the copper substrate (1).

There is no electron migration problem. In the COF structure, because there is no metal adhesion layer between the copper substrate and the polyimide substrate (3), before sputtering the copper on the substrate (1), an interface metal such as Cr having a good bonding force with the polyimide substrate is applied to the polyimide layer. However, during the etching process, the added adhesion metal is not easily removed, which causes electron migration. With the method of the present invention, the electron migration problem is solved.

Because the slender wiring is formed on the copper substrate (1) with high stiffness and then the copper substrate (1) is pressed on the polyimide substrate (3) having therein an adhesion layer (3a), the choice of metal is not important any more. As a consequence, the manufacture cost is low.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A method for forming a wiring pattern comprising the steps of:

preparing a copper substrate with a stiffness capable of sustaining the formation of the wiring pattern thereon;

applying a photo resist material to form a patterned photo-resist on the copper substrate;

plating a copper nickel layer on a portion of the copper substrate by using the patterned photo resist as a mask;

stripping off the patterned photoresist then thermal treating the plated copper substrate;

combining the plated copper substrate with a soft polyimide substrate by using an adhesive layer therebetween;

etching the copper substrate to expose the copper nickel layer after the combining step; and welding an integrated circuit to contact the exposed copper nickel layer.

2. The method as claimed in claim 1, wherein the plated copper substrate is entirely etched through.

3. The method as claimed in claim 1, wherein the plated copper substrate is partially etched through so that a portion of the plated copper substrate remains in connection with the copper nickel layer.

4. The method as claimed in claim 1, wherein the step of thermal treating the plated copper substrate is performed before the combining step.

5. A method for forming a wiring pattern comprising the steps of:

providing a copper substrate with a stiffness capable of sustaining the formation of the wiring pattern thereon;

forming a patterned photoresist on the copper substrate;

plating a copper nickel layer on a portion of the copper substrate by using the patterned photo resist as a mask so as to form a first layer of wiring pattern;

stripping off the patterned photoresist;

thermal treating the plated copper substrate;

combining the plated copper substrate with a polyimide substrate by using an adhesive layer therebetween;

removing a portion of the copper substrate after the combining step to form a second layer of wiring pattern and expose the first layer of wiring pattern; and welding an integrated circuit to contact the exposed first layer of wiring pattern.

* * * * *